(12) United States Patent
Sam et al.

(10) Patent No.: US 9,881,835 B1
(45) Date of Patent: Jan. 30, 2018

(54) NANOWIRE DEVICES, SYSTEMS, AND METHODS OF PRODUCTION

(71) Applicant: UVic Industry Partnerships Inc., Victoria (CA)

(72) Inventors: Mahshid Sam, Victoria (CA); Rustom B. Bhiladvala, Victoria (CA); Nima Moghimian, Victoria (CA)

(73) Assignee: UVic Industry Partnerships Inc., Victoria, CA (US)

( * ) Notice: Subject to any disclaimer, the term of this patent is extended or adjusted under 35 U.S.C. 154(b) by 0 days.

(21) Appl. No.: 15/331,554

(22) Filed: Oct. 21, 2016

(51) Int. Cl.
  *H01L 21/768* (2006.01)
  *H01L 23/528* (2006.01)
  *H01L 23/532* (2006.01)

(52) U.S. Cl.
  CPC .. *H01L 21/76892* (2013.01); *H01L 21/76879* (2013.01); *H01L 23/5283* (2013.01); *H01L 23/53242* (2013.01); *H01L 23/53276* (2013.01); *H01L 2221/1094* (2013.01)

(58) Field of Classification Search
  CPC ......... H01L 21/76892; H01L 21/76879; H01L 23/53276; H01L 23/53242; H01L 23/5283; H01L 2221/1094; B82Y 10/00
  See application file for complete search history.

(56) References Cited

U.S. PATENT DOCUMENTS

| | | | | |
|---|---|---|---|---|
| 2002/0130311 A1* | 9/2002 | Lieber | ...................... | B01J 23/50 257/1 |
| 2008/0224123 A1* | 9/2008 | Martin | ...................... | B82B 3/00 257/23 |

OTHER PUBLICATIONS

Dow Technical Data Sheet for Isopropyl Alcohol.*
Chaste et al.: "A Nanomechanical mass sensor with yoctogram resolution", Nature Nanotechnology; vol. 7, pp. 301-304, May 2012; www.nature.com/naturenanotechnology (5 pages).
Sage et al.; "Neutral particle mass spectrometry with nanomechanical systems", Nature Communications; vol. 6, pp. 6482-6487; 2015; www.nature.com/naturecommunications (5 pages).
Ilic et al.; "Enumeration of DNA Molecules Bound to a Nanomechanical Oscillator", Nano Letters, American Chemical Society; vol. 5, No. 5, pp. 925-929; 2005 (5 pages).
Heidelberg et al. "A Generalized Descriptionof the Elastic Properties of Nanowires", Nano Letters: American Chemical Society; vol. 6, No. 6; pp. 1101-1106, 2006 (6 pages).
Li et al.; "Template-Grown Metal Nanowires as Resonators: Performance and Characteristics of Dissipative and Elastic Properties", Nano Letters: American Chemical Society; vol. 7, No. 11 pp. 3281-3284; 2007 (4 pages).

(Continued)

*Primary Examiner* — Michael Jung
*Assistant Examiner* — Charles R Peters
(74) *Attorney, Agent, or Firm* — Klarquist Sparkman, LLP

(57) ABSTRACT

A method of depositing nanowires including generating wells disposed on a patterned conductive film. The patterned conductive film includes well-sites. The patterned conducive film covers a portion of a surface of a substrate. Each of the wells is disposed proximate to a corresponding wellsite. The method includes applying a nanowire mixture to the wells and, after applying the nanowire mixture, at least one nanowire is deposited on a first portion and a second portion of the patterned conductive film by generating an electric field proximate to the patterned conductive film. The first portion and the second portion of the patterned conductive film are separated by a gap.

17 Claims, 16 Drawing Sheets

(56) References Cited

OTHER PUBLICATIONS

Wu et al.; "Synthesis and Electrical and Mechanical Properties of Silicon and Germanium Nanowires", Chem. Mater., American Chemical Society; vol. 20, pp. 5954-5967; 2008 (14 pages).
Bhiladvala et al.; "Effect of fluids on the Q factor and resonance freguency of oscillating micrometer and nanometer scale beams", Physical Review E: American Physical Society; vol. 69, pp. 036307-01-036307-05; 2004 (5 pages.
Lu et al.; "Semiconductor nanowires" Journal of Physics D: Applied Physics; vol. 39, pp. R387-R406; 2006 (21 pages).
Boote et al.; "Dielectrophoric Manipulation and electircal characterization of gold nanowires", Nanotechnology: Institute of Physics Publishing; vol. 16, pp. 1500-1505; 2005 (6 pages).
Sioss et al., "Nanoresonator chip-based RNA sensor strategy for detection of circulating tumor cells: response using PCA3 as a prostate cancer marker", Nanomedicine: Nanotechnology, Biology, and Medicine; vol. 8, pp. 1017-1025, 2012 (8 pages).
Dasgupta et al.; "Semiconductor Nanowires—Synthesis, Characterization, and Applications", Advanced Materials; vol. 26, pp. 2137-2184; 2014; www.wileyonlinelibrary (48 pages).
Freer et al. "High-yeild self-limiting single-nanowire assembly with dielectrophoresis", Nature Nanotechnology; vol. 5, pp. 525-530; Jul. 2010; wwww.nature.com/naturenanotechnology (7 pages).
Smith et al.; "Deterministic Assembly of Functional Nanostructures Using Nonuniform Electric Fields", Annual Review of Physical Chemistry; vol. 63, pp. 241-263; 2012; www.physchem.annualreviews.org (27 pages).
Raychaudhuri et al.; "Precise Semiconductor Nanowire Placement Through Dielectrophoresis", Nano Letters; vol. 3, No. 6, pp. 2260-2266; 2009 (7 pages).
Li et al.; "Bottom-up assembly of large-are nanowire resonator arrays", Nature Nanotechnology; vol. 3, pp. 88-92, Feb. 2008; www.nature.com/naturenanotechnology (5 pages).
Wang et al.; "Directed assembly of nanowires", Materials Today; vol. 12, No. 5, pp. 34-43, May 2009 (10 pages).
Whang et al.; "Large-Scale Heirarchical Organization of Nanowire Arrays for Integrated Nanosystems", Nano Letters; vol. 3, No. 9, pp. 1255-1259; 2003 (5 page).
Palapati et al.; "Single nanowire manipulation within dielectrophoretic force fields in the sub-crossover frequency regime", Royal Society of Chemistry, Nanoscale; vol. 7, pp. 3109-3116; 2015; www.rsc.org/nanoscale (8 pages).
Colletet al.; "Large-Scale Assembly of Single Naonwires through Capillary-Assisted Dielectrophoresis", Advanced Materials; vol. 27, pp. 1268-1273; 2015; www.advmat.de (6 pages).
Burg et al.; "Electrokinetic framework of dielectrophoric deposition devices", Journal of Applied Physics; vol. 107, pp. 124308-01-124308-11; Jun. 2010; www.aip.org (12 pages).
Maijenburg et al.; "Dielectrophoretic alignment of metal and metal oxide nanowires and nanotubes: A universal set of parameters for bridging prepatterned microelectrodes", Journal of Colloid and Interface Science; vol. 355, pp. 486-493; 2011; www.elsevier.com/locate/jcis (8 pages).
Liu et al.; "Dielectrophoretic Assembly of Nanowires", J. Phys. Chem. B; vol. 110, pp. 14098-14106; 2006 (9 pages).
Castellanos et al.; "Electrohydrodynamics and dielectrophoresis in microsystems: scaling laws", Journal of Physics D: Applied Physics; vol. 36, pp. 2584-2597; 2003; www.stacks.iop.org/JPhysD/36/2584 (14 pages).
Luecke et al.; "Electrical Conductivity and pHe Response of Fuel Ethanol Contaminants", Energy and Fuels, National Renewable Energy Labortory; vol. 28, pp. 5222-5228; 2014 (7 pages).
Green et al.; "Fluid flow induced by nonuniform ac electric fields in electrolytes on microelectrodes", Physical Review E., The American Physical Society; vol. 61, No. 4, pp. 4011-4018, Apr. 2000 (8 pages).
Gierhart et al.; "Frequency Dependence of Gold Nanoparticle Superassembly by Dielectrophoresis", American Chemical Society, Langmuir; vol. 23, No. 24, pp. 12450-12456; 2007 (7 pages).
Mirtaheri et al.; "Electrode Polarization Impedance in Weak NaCl Aqueous Solutions", IEEE Transations on Biomedical Engineering; vol. 52, No. 12, pp. 2093-2099, Dec. 2005 (7 pages).
Bazant et al.; "Diffuse-charge dynamics in electrochemical systems", Physical Review E: The American Physical Society; vol. 70, pp. 021506-021524, 2004 (24 pages).
Moghimian et al., "Rhodium nanowires: synthesis and nanostructure tailoring by controlling hydrogen evolution", Material Letters, Elsevier; vol. 113, pp. 152-155; 2013; www.elsevier/com/locate/matlet (4 pages).
Kim et al, "Inorganic semiconductor nano-materials for flexible and stretchable bio-integrated Electronics", NPG Asia Materials; vol. 4; Mar. 2012; www.nature.com/am (9 pages).
Ellmer, "Past achievements and future challenges in the development of optically transparent electrodes", Nature Photonics; vol. 6, pp, 809-817, Dec. 2012; www.nature.com/naturephotonics (9 pages).
Lee et al, "Solution-Processed Metal Nanowire Mesh Transparent Electrodes", Nano Letters, American Chemical Society; vol. 8, No. 2, pp. 689-692; 2008 (4 pages).
Hu et al., "Scalable Coating and Properties of Transparent, Flexible, Silver Nanowire Electrodes", ACS Nano; vol. 4, No. 5, pp. 2955-2963, 2010; www.acsnano.org (9 pages).
Nirmalraj et al., "Manipulating Connectivity and Electrical Conductivity in Metallic Nano wire Networks", Nano Letters, American Chemical Society; vol. 12, pp. 5966-5971; 2012; www.pubs.acs.org/NanoLett (6 pages).
Wu, et al., "A transparent electrode based on a metal nano trough network", Nature Nanotechnology; vol. 8, No. 6, pp. 421-425, Jun. 2013; www.nature.com/naturenanotechnology (5 pages).
Kang, "Organic Solar Cells Using Nanoimprinted Transparent Metal Electrodes", Advanced Materials; vol. 20, pp. 4408-4413; 2008 (6 pages).
Bhatt et al., "Control and Modeling of the Dielectrophoretic Assembly of On-Chip Nanoparticle Wires", Langmuir, pp. 467-476; Sep. 24, 2003 (10 pages).
Kretschmer et al., "Pearl chain formation of nanoparticles in microelectrode gaps by dielectrophoresis", Langmuir, American Chemical Society; vol. 20, 99. 11797-11801, 2004 (5 pages).
House et al., "Numerical study on dielectrophoretic chaining of two ellipsoidal particles", Journal of Colloid and Interface Science; vol. 374, pp. 141-149, 2012 (9 pages).
Ahmed et al., "Quantitative analysis of gold nanorod alignment after electric field-assisted deposition", Nano Letters, American Chemical Society; vol. 9, No. 11, pp. 3786-3794; 2009 (9 pages).
Cherukulappurath et al., "Rapid and sensitive in Situ SERS Detection Using Dielectrophoresis", Chemistry of Materials, American Chemical Society Publications; vol. 26, pp. 2445-2452; 2014 (8 pages).
Papadakis et al., "Quantitative analysis of parallel nanowire array assembly by dielectrophoresis", Nanoscale, The Royal Society of Chemistry; vol. 3, pp. 1059-1065; 2011; www.rsc.org/nanoscale (7 pages).
Boehm et al., "Formation and Frequency Response of Two-Dimensional Nanowire Lattices in an Applied Electric Field", Langmuir, American Chemical Society Publications; vol. 31, pp. 5779-5786; 2015 (8 pages).
Garnett et al., "Self-limited plasmonic welding of silver nanowire junctions", Nature Materials; vol. 11, pp. 241-249; Mar. 2012; www.nature.com/naturematerials (10 pages).

* cited by examiner

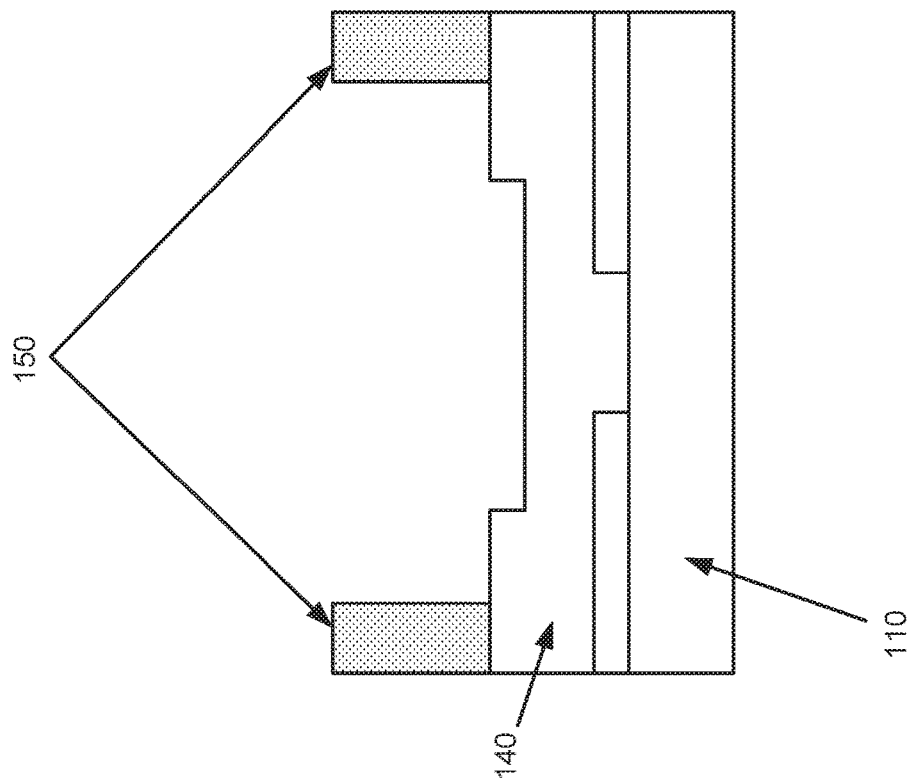
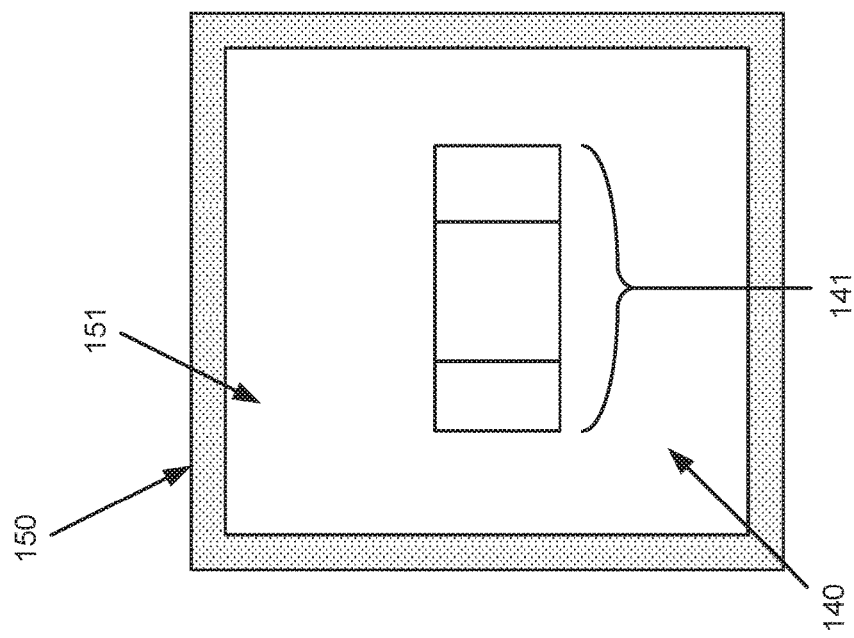
FIG. 3F
FIG. 3E

NANOWIRE DEVICES, SYSTEMS, AND METHODS OF PRODUCTION

BACKGROUND

Electronic devices such as integrated circuits are produced using lithographic processing. Lithographic processing facilitates the production of planar layers of various materials. An integrated circuit may include layers of semiconductors, metals, and dielectrics. Each of the aforementioned layers may be patterned to form semiconducting devices such as, for example, transistors or diodes.

SUMMARY

In one aspect, a method of depositing nanowires in accordance with one or more embodiments of the invention including generating wells disposed on a patterned conductive film. The patterned conductive film includes well-sites. The patterned conducive film covers a portion of a surface of a substrate. Each of the wells is disposed proximate to a corresponding wellsite. The method includes applying a nanowire mixture to the wells and, after applying the nanowire mixture, at least one nanowire is deposited on a first portion and a second portion of the patterned conductive film by generating an electric field proximate to the patterned conductive film. The first portion and the second portion of the patterned conductive film are separated by a gap.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 3E shows a top view diagram of an example of a dam in accordance with one or more embodiments of the invention.

FIG. 3F shows a side view diagram of the example dam of FIG. 3E in accordance with one or more embodiments of the invention.

DETAILED DESCRIPTION

Figure 1B:
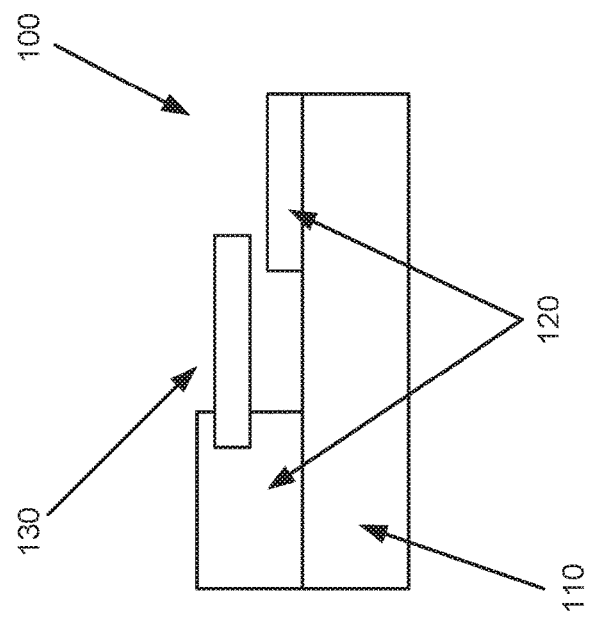
FIG. 1B shows a side view diagram of a nanowire device accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of FIGS. 1A-4, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment, which may be implemented in addition to, in conjunction with, or in place of the embodiments described with regard to a corresponding like-named component in any other figure.

In general, embodiments of the invention relate to nanowire devices, systems that include nanowire devices, and methods for producing nanowire devices and/or systems. A nanowire device may be an electronic and/or an electromechanical device that utilizes a nanowire in the operation and/or function of the device. Nanowires may provide capabilities that are otherwise unattainable in devices that are produced using lithographic manufacturing techniques alone.

A nanowire device in accordance with one or more embodiments of the invention includes a single nanowire disposed in a gap between electrical conductors of a circuit. The circuit may apply electrical current to the electrical conductors and thereby apply the electrical current to the nanowire.

A system in accordance with one or more embodiments of the invention may include multiple nanowire devices disposed in individual gaps between electrical conductors of one or more circuits. Each of the nanowire devices may be separately addressable by the one or more circuits and thereby electrical current may be selectively applied to one or more nanowires.

A method of manufacturing nanowire devices in accordance with one or more embodiments of the invention may include depositing nanowires in gaps of an electrical circuit via a wet solution processing technique. By wet solution processing, the nanowires may be placed in any number of corresponding gaps in a short period of time. During the wet solution processing, electric fields may be applied to a mixture including nanowires that preferentially directs single nanowires to be disposed in each gap during the wet solution processing.

Figure 1A:
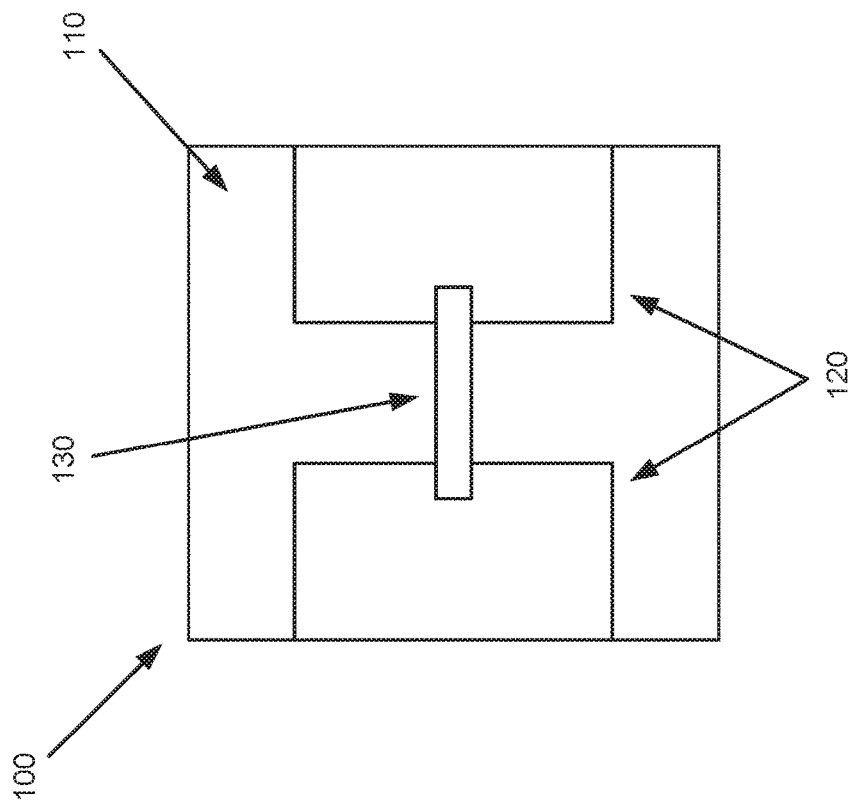
FIG. 1A shows a top view diagram of a nanowire device accordance with one or more embodiments of the invention.

FIG. 1A shows a top view diagram of a nanowire device (100) in accordance with one or more embodiments of the invention. The nanowire device (100) may function as, for example, a sensor, a diode, a transistor, or any other type of electronic device. The nanowire device (100) may be integrated as a component of a larger electronic device or system. The nanowire device (100) includes a substrate (110), a patterned conductive film (120) disposed on the substrate (110), and a nanowire (130) disposed on the patterned conductive film (120). Each of the aforementioned components of the nanowire device (100) is described below.

The substrate (110) may be a physical structure on which other components of the system are disposed. In one or more embodiments of the invention, the substrate may be a wafer. The wafer may be, for example, silicon, gallium nitride, or other semiconducting materials. In one or more embodiments of the invention, the substrate may be a planar slab. The planar slab may be, for example, aluminum oxide, glass, sapphire, or other dielectric materials. In some embodiments of the invention, the substrate may be a polymer film such as polyimide, polyethylene terephthalate, nylon, or any other type of plastic film. The substrate (110) may be other materials without departing from the invention.

The patterned conductive film (120) may be a physical structure disposed on the substrate (110). The patterned conductive film (120) may be a metal such as, for example, copper, gold, silver, tin, aluminum, or any other conducting metal. The patterned conductive film (120) may be other conductive materials without departing from the invention.

The patterned conductive film (120) may be divided into a number of portions to form an electric circuit. The electric circuit may include a number of gaps. A nanowire may be disposed across each gap. For example, a first end of a nanowire may be directly connected to a first side of a gap in the electric circuit and a second end of the nanowire may be directly connected to a second side of the gap in the electric circuit. The electric circuit may electrically connect each end of each nanowire to other electronic devices of the circuit. The other electronic devices may be transistors, diodes, amplifiers, filters, digital signal processors, or any other type of electronic component.

The nanowire (130) may be a physical structure. The nanowire (130) may by a cylindrical structure formed of one or more materials that has a length that is much larger than its diameter. For example, a nanowire may have a diameter of 100 nanometers and a length of 10 micrometers. The nanowire (130) may have other lengths and/or diameters without departing from the invention.

The nanowire (130) may be disposed across a gap in the patterned conductive film (120). In one or more embodiments of the invention, a first end of the nanowire (130) may be directly connected to the patterned conductive film (120) at a first end of the gap and directly connected to the patterned conductive film (120) at a second end of the gap.

In other embodiments of the invention, only one end of the nanowire may be connected to the patterned conductive film (120) and the other end of the nanowire may not be connected to the patterned conductive film (120). For example, the other end may be suspended above the patterned conductive film (120) or may be separated from the patterned conductive film (120) by a separation layer (not shown). The separation layer may electrically isolate the other end of the nanowire (130) from the patterned conductive film (120). FIG. 1B shows a side view of the nanowire device (100) shows in FIG. 1A. As seen from FIG. 1B, one end of the nanowire (130) may be suspended above the patterned conductive film (120).

Embodiments of the invention include method of producing nanowire devices. The methods may enable nanowire devices to be produced quickly and at low cost. FIGS. 2A-2F illustrate method of producing nanowire devices in accordance with embodiments of the invention.

Figure 2A:
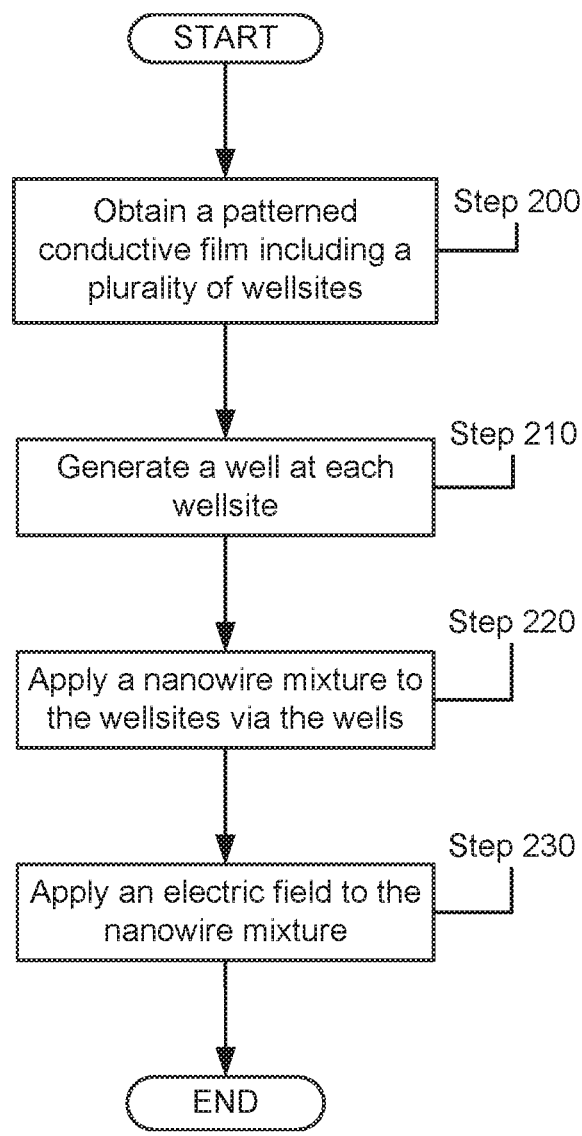
FIG. 2A shows a flowchart of a method of producing a nanowire device in accordance with one or more embodiments of the invention.

FIG. 2A shows a flowchart in accordance with one or more embodiments of the invention. The method depicted in FIG. 2A may be used to produce a nanowire device in accordance with one or more embodiments of the invention. One or more steps shown in FIG. 2A may be omitted, repeated, and/or performed in a different order among different embodiments. For example, Step 220 may be performed Step 230 without departing from the invention. The method shown in FIG. 2A may be performed by, for example, a factory or other manufacturing facility.

In Step 200, a patterned conductive film is obtained. The obtained patterned conductive film may be disposed on a substrate. The patterned conductive film may be obtained by the method shown in FIG. 2B. The patterned conductive film may be obtained via other methods without departing from the invention.

The patterned conductive film may include a number of well-sites where individual nanowires are to be disposed. The well-sites may be, for example, portions of the patterned conductive film that include gaps.

In Step 210, one or more wells are generated. The wells may be structures that enable a material including nanowires to be disposed on a corresponding well-site and prevent the material including nanowires from being disposed on the remaining portion of the patterned conductive film. The wells may be generated by the method shown in FIG. 2C. The wells may be generated via other methods without departing from the invention.

In Step 220, a nanowire mixture may be applied to the well-sites via the wells. The nanowire mixture may include a number of nanowires and a fluid. The nanowire mixture may be applied by depositing the nanowire mixture across the wells and thereby proximate to the well-sites. The nanowire mixture may be applied to the well-sites by the method shown in FIG. 2D. The nanowire mixture may be applied to the well-sites by another method without departing from the invention.

In Step 230, an electric field is applied to the nanowire mixture. The electric field may be applied while the nanowire mixture is disposed on the well-sites. The electric field may be applied by the method shown in FIG. 2E. The electric field may be applied by other methods without departing from the invention.

In one or more embodiments of the invention, the method may end following Step 230. In other embodiments of the invention, the method may continue following the method shown in FIG. 2F.

Figure 2B:
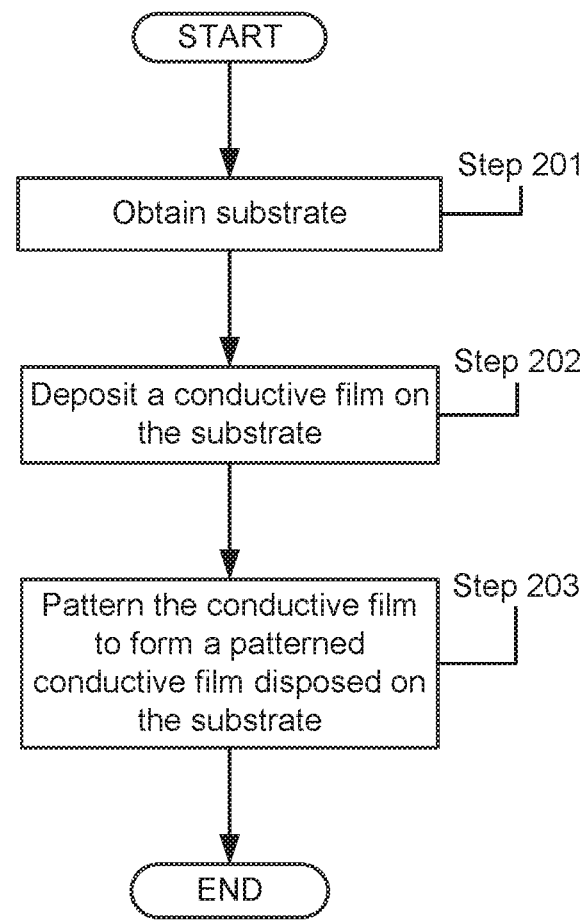
FIG. 2B shows a flowchart of a method of forming a patterned conductive film in accordance with one or more embodiments of the invention.

FIG. 2B shows a flowchart in accordance with one or more embodiments of the invention. The method depicted in FIG. 2B may be used to obtain a patterned conductive film in accordance with one or more embodiments of the invention. One or more steps shown in FIG. 2B may be omitted, repeated, and/or performed in a different order among different embodiments.

In Step 201, a substrate is obtained. The substrate may be a physical structure such as a wafer, a slab, a circuit card, a plastic film, or other structure for support of other structures.

In Step 202, a conductive film is deposited onto the substrate. The conductive film may be a metal film. The metal film may be copper, gold, silver, aluminum, tin, or other conductive metal. The conductive film may be another conductive material, other than a metal, without departing from the invention. For example, the conductive film may be indium tin oxide or a conductive polymer. In one or more embodiments of the invention, the conductive film may have a conductivity greater than 10000 Siemens per meter. In one or more embodiments of the invention, the conductive film may have a conductivity greater than 100 Siemens per meter and less than 100000 Siemens per meter.

The conductive film may be deposited by chemical deposition, physical deposition, or other methods. Chemical deposition may be performed by electroplating, electroless plating, chemical bath deposition, spin coating, chemical vapor deposition, atomic layer deposition, or any other chemical deposition process. Physical deposition may be performed by physical vapor deposition, sputtering, molecular beam epitaxy, pulsed laser deposition, cathodic arc deposition, electrohydrodynamic deposition, or any other type of physical deposition process.

In Step 203, the conductive film is patterned. Patterning the conductive film may form a patterned conductive film. The patterned conductive film may include any number of tracks, gaps, well-sites for placement of nanowires, or any other features of an electric circuit.

The conductive film may be patterned by photolithographic methods, machine, laser ablation, or any other method of selectively removing portions of the conductive film to form a pattern.

The method may end following Step 203.

Figure 2C:
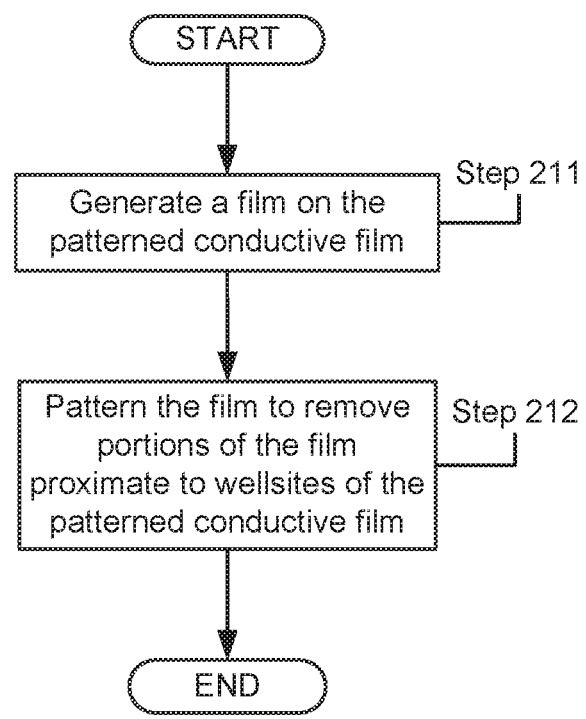
FIG. 2C shows a flowchart of a method of forming wells in accordance with one or more embodiments of the invention.

FIG. 2C shows a flowchart in accordance with one or more embodiments of the invention. The method depicted in FIG. 2C may be used to generate a well at each well-site in accordance with one or more embodiments of the invention. One or more steps shown in FIG. 2C may be omitted, repeated, and/or performed in a different order among different embodiments.

In Step 211, a film is generated on the patterned conductive film. The film may be a dielectric material. The film may be an insulator. The film may be a photoresist. The film may cover each well-site of the patterned conductive film.

In Step 212, a film is patterned to remove portions of the film proximate to each well-site of the patterned conductive film to form wells. The wells may be apertures, perforations, indentations, or other structures that penetrate into or through the film. The wells may enable a material including nanowires to be disposed proximate to the well-sites while preventing the material including nanowires from being disposed proximate to any other portion of the patterned conductive film. The film may be patterned by performing photolithography on the film.

The method may end following Step 212.

Figure 2D:
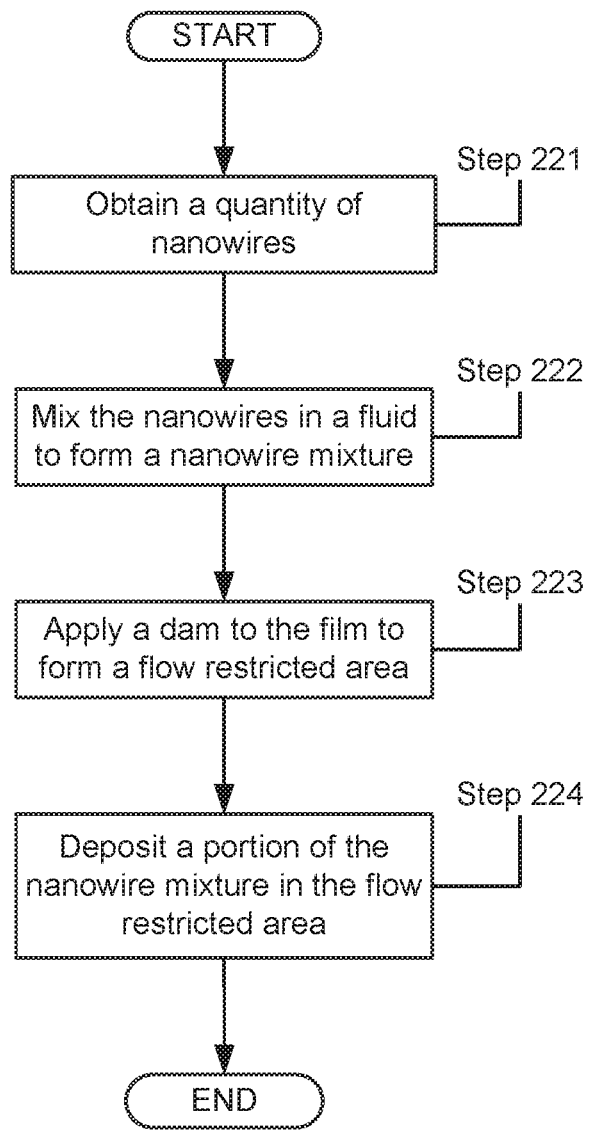
FIG. 2D shows a flowchart of a method of applying a mixture including nanowires in accordance with one or more embodiments of the invention.

FIG. 2D shows a flowchart in accordance with one or more embodiments of the invention. The method depicted in FIG. 2D may be used to apply a nanowire mixture to well-sites in accordance with one or more embodiments of the invention. One or more steps shown in FIG. 2D may be omitted, repeated, and/or performed in a different order among different embodiments.

In Step 221, a quantity of nanowires may be obtained. The nanowires may be of any material as may be desired. For example, the nanowires may be a semiconducting material. In one or more embodiments of the invention, the nanowires may be rhodium. In other embodiments of the invention, the nanowires may be carbon nanotubes.

In one or more embodiments of the invention, the nanowires may have an average length that is less than 2.5 times the width of a gap in the patterned conductive film. In one or more embodiments of the invention, the nanowires may have an average length that is less than twice the width of a gap in the patterned conductive film. In one or more embodiments of the invention, the nanowires may have an average length that is less than 1.5 times the width of a gap in the patterned conductive film. In one or more embodiments of the invention, the nanowires may have an average length that is approximately the same as a width of a gap in the patterned conductive film. As used herein, approximately the same as the width of the gap is between 100% and 150% of the width of the gap. Selecting an average length in this range may prevent disruptive torque forces from preventing both ends of a nanowire from being placed inside a well proximate to a well-site. One of ordinary skill in the art will appreciate that nanowires may have varying lengths and an average length of the nanowires refers to a mean length of each of the nanowires.

In one or more embodiments of the invention, the quantity of nanowires is the same as the number of well-sites, e.g., one nanowire for each well-site. In one or more embodiments of the invention, the quantity of nanowires is twice the number of well-sites, e.g., two nanowires for each well-site. In one or more embodiments of the invention, the quantity of nanowires is three times the number of well-sites, e.g., three nanowires for each well-site. In one or more embodiments of the invention, the quantity of nanowires is between 1.5 times and 2.5 times the number of well-sites, e.g., one point five to two point five nanowires for each well-site. Selecting a quantity of nanowires in this range may prevent the nanowires from aggregating while in solution and/or prevent/reduce the likely hood of positioning more than one nanowire in each well-site while still providing a sufficient quantity of nanowires so that each well-site receives a nanowire.

In Step 222, the nanowires are mixed with a second material to form a mixture.

The second material may be a fluid. In one or more embodiments of the invention, mixing the nanowires with the second material may suspend the nanowires in the second material. In one or more embodiments of the invention, the second material has a lower electrical conductivity than the nanowires.

In one or more embodiments of the invention, the fluid may have a low viscosity. As used herein, a low viscosity is less than 5 centipoise. In one or more embodiments of the invention, the fluid may have a very low viscosity. As used herein, a very low viscosity is less than 2 centipoise.

The fluid may be, for example, ethanol. The fluid may be other materials or combinations of materials without departing from the invention. For example, the fluid may be a mixture of ethanol and methanol, a mixture of ethanol and water, a mixture of ethanol and ethylene glycol, or other mixtures of fluids. The fluid may include a polar solvent, a non-polar solvent, or a combination thereof. The non-polar solvent may be, for example, carbon tetrachloride.

In one or more embodiments of the invention, the mixture including the nanowires may be formed by stirring the nanowires into a predetermined quantity of the second material. In one or more embodiments of the invention, the mixture including the nanowires may be formed by sonicating the nanowires into a predetermined quantity of the second material.

The mixture may include other materials such as ligands, stabilizers, polymers, or other materials. The other materials may improve the ability of the nanowires to be suspended in the second material. The other materials may modify a viscosity, surface tension, wetting, or other rheological property of the mixture.

In Step 223, a dam is applied to the film to form a flow restricted area. A dam may be a physical structure, such as a gasket, that forms a seal between the dam and the film when the dam is pressed against the film. The seal between the dam and the film may prevent a mixture included nanowires from flowing alone the surface of the film and thereby form a flow restricted area. The flow restricted area may be formed around all of the well and well-sites.

In one or more embodiments of the invention, restricting the flow of the mixture within the flow restricted area may increase an evaporation time of a fluid of the nanowire mixture when compared to an evaporation time of the nanowire mixture when placed on a substrate that does not include a flow restricted area. Increasing the evaporation time of the fluid of the nanowire mixture may increase the likelihood of depositing a nanowire at each well-site by providing a longer duration of time during which nanowires of the nanowire mixture are suspended in the fluid of the nanowire mixture.

In Step 224, a portion of the mixture including nanowires is deposited in the flow restricted area. The portion may be deposited by, for example, pipetting, dispensing, or otherwise transporting the portion to the flow restricted. When in the flow restricted area, the mixture may flow along the film, into the wells, and thereby be disposed on or proximate to each of the well-sites within the flow restricted area.

For example, if a well is formed as a depression in a film, the mixture may flow into the depression. The depression may be proximate to a well-site.

In another example, if the well is formed as a perforation through the film, the mixture may flow through the perforation and be in direct contact with a portion of a well-site. The portion of the well-site may be, for example, a portion of a patterned conductive film near a gap in the patterned conductive film.

The method may end following Step 224.

Figure 2E:
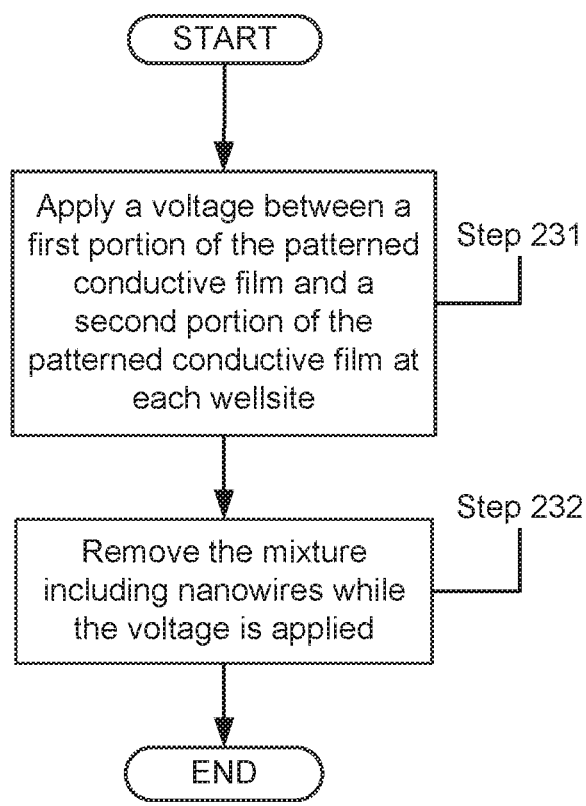
FIG. 2E shows a flowchart of a method of applying an electric field to a mixture including nanowires in accordance with one or more embodiments of the invention.

FIG. 2E shows a flowchart in accordance with one or more embodiments of the invention. The method depicted in FIG. 2E may be used to apply an electric field to the nanowire mixture in accordance with one or more embodiments of the invention. One or more steps shown in FIG. 2E may be omitted, repeated, and/or performed in a different order among different embodiments.

In Step 231, a voltage may be applied between a first portion of the patterned conductive film and a second portion of the patterned conductive film at each well-site. Each of the first portion and the second portion of the patterned conductive film may be disposed on opposite sides of a gap in the patterned conductive film. Applying the voltage may generate an electric field across the gap. The electric field may be a fringing field that extends above the plane, in the plane, and below the plane in which the patterned conductive film lies and thereby extends to a well regardless of its location with respect to the gap. The voltage may be applied while the mixture including nanowires is disposed on the well or well-site. In one or more embodiments of the invention, the voltage is applied before the mixture is disposed on the well or well-site. Applying the voltage may polarize the nanowires. Polarizing the nanowires may cause a nanowire to be positioned across the gap. Once the nanowire is positioned, the nanowire may form a conduction path and thereby terminate the electric field in the gap. By terminating the electric field in the gap, other nanowires in the suspension will not be positioned to bridge the gap and, thus, results in single nanowires being deposited in each gap.

In one or more embodiments of the invention, a film may be disposed on the patterned conductive film that prevents electrical contacts between the nanowires and the patterned conductive film from being formed. Doing so may improve the likelihood of placing a nanowire in each well-site.

In one or more embodiments of the invention, the electric field may be a time varying field. For example, an alternating voltage source may be applied between the first portion of the patterned conductive film and the second portion of the patterned conductive film. In one or more embodiments of the invention, the time varying field may have a frequency of less than $10^{10}$ Hz, i.e., less than 10 gigahertz. In one or more embodiments of the invention, the time varying field may have a frequency of greater than $10^4$ Hz, i.e., greater than 10 kilohertz. In one or more embodiments of the invention, the time varying field may have a frequency of greater than $10^5$ Hz, i.e., greater than 100 kilohertz. In one or more embodiments of the invention, the time varying field may have a frequency of greater than $10^6$ Hz, i.e., greater than 1 megahertz. In one or more embodiments of the invention, the time varying field may have a frequency of greater than $10^5$ Hz and less than $10^{10}$ Hz, i.e., greater than 1 megahertz. A frequency in the ranges disclosed herein may prevent polarization of the first portion of the patterned conductive film and second portion of the patterned conductive film that repel nanowires from well-sites and may prevent formation of electroosmotic flows adjacent to the patterned conductive film that would repel the nanowires from the well-sites.

In one or more embodiments of the invention, the time varying field may have a minimum frequency determined by the following equations:

$$\beta = N_V - N_{EO}$$

$$N_{EO} = \frac{v}{v_{max}} = \frac{4\Omega^2}{(1+\Omega^2)^2}$$

-continued
$$\Omega = \frac{\pi}{2} x \kappa \omega \left( \frac{\varepsilon_m}{\sigma_m} \right)$$

$$N_V = \frac{V_{\mathit{eff}}}{V_{rms}} = \left| \frac{1}{1 + \frac{2}{j\omega R_S C_{eq}}} \right| = \frac{1}{\sqrt{1 + \left( \frac{2}{\omega R_S C_{eq}} \right)^2}}$$

where Rs is the electrical resistance of a fluid component of the nanowire mixture between the portions of the patterned conductive film on either side of the gap at a well-site, Ceq is the capacitance between the portions of the patterned conductive film on either side of the gap at a well-site, w is $2\pi f$, $\in_m$ is the permittivity of the fluid component of the nanowire mixture, x is half the width of the gap, κ is the reciprocal Debye length of a double layer, $\sigma_m$ is the electrical conductivity of the nanowire mixture. The above set of equations only includes a single independent variable, f, the frequency of the applied electric field. The frequency may be varied to maximize β. The frequency that maximizes β may be selected as the minimum frequency of the time varying field.

In one or more embodiments of the invention, selecting the frequency of the time varying field utilizing the above equations may prevent electrode polarization forces and electroosmotice forces from disrupting nanowire positioning.

In one or more embodiments of the invention, the voltage may have a root-mean-square (rms) magnitude of greater than 4 Vrms. In one or more embodiments of the invention, the voltage may have a root-mean-square magnitude of greater than 5 Vrms. In one or more embodiments of the invention, the voltage may have a root-mean-square magnitude of greater than 6 Vrms. In one or more embodiments of the invention, the voltage may have a root-mean-square magnitude of greater than 7 Vrms. In one or more embodiments of the invention, the voltage may have a root-mean-square magnitude of greater than 4 Vrms and less than 10 Vrms. In one or more embodiments of the invention, the voltage may have a root-mean-square magnitude of greater than 4 Vrms and less than 7 Vrms. Voltages outside these disclosed ranges may not sufficiently polarize the nanowires to attract the nanowires to the well-sites and thereby fail to cause the nanowires to be placed properly.

In Step 232, the mixture including nanowires is removed. The mixture including nanowires may be removed by evaporating a liquid portion of the mixture and leaving the nanowires included in the mixture behind. The mixture may be removed by other methods without departing from the invention.

Removing the mixture may result in a nanowire of the mixture being deposited at each well-site of the patterned conductive film. Each nanowire may be disposed across a corresponding gap at each well-site.

The method may end following Step 232.

Figure 2F:
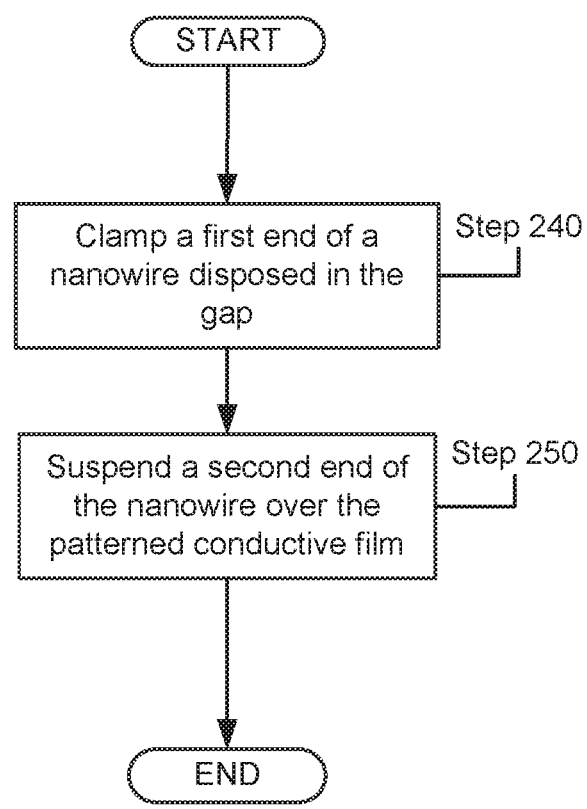
FIG. 2F shows a flowchart of a continuation of the method of FIG. 2A in accordance with one or more embodiments of the invention.

FIG. 2F shows a flowchart in accordance with one or more embodiments of the invention. The method depicted in FIG. 2F may be a continuation of the method shown in FIG. 2A in accordance with one or more embodiments of the invention. One or more steps shown in FIG. 2F may be omitted, repeated, and/or performed in a different order among different embodiments.

In Step 240, a first end of each nanowire may be clamped to the patterned conductive film. The first end may be clamped using any method including, but not limited to, metal vapor deposition, atomic layer deposition, electro-chemical deposition, electroless deposition, and a combination of sputtering and photolithography. Clamping the first end of the nanowire may cause the first end of the nanowire to be fixedly attached to the patterned conductive film. Attaching the first end of the nanowire may form an electrical connection between the nanowire and the patterned conductive film.

In one or more embodiments of the invention, clamping the first end of the patterned conductive film may include removing a portion of a film disposed on a portion of the patterned conductive film proximate to the first end of the nanowire and depositing a conductor on the exposed portion of the patterned conductive substrate to form a contact between the first end of the nanowire and the exposed portion of the patterned conductive substrate.

In Step 250, a second end of each nanowire may be suspended over the patterned film. The second end of each nanowire may be suspended by any method including, but not limited to, performing a lift off procedure or a critical point drying procedure.

In one or more embodiments of the invention, the send end of each nanowire may be suspended by removing a portion of a film disposed between the second end of each nanowire and a corresponding portion of the patterned conductive substrate.

Alternatively, the second end of each nanowire may be clamped to the patterned conductive film at a location opposite of the first end of each nanowire of a gap. In other words, each end may be clamped to opposite sides of a gap of the patterned conductive film.

The method may end following Step 250.

Figure 2G:
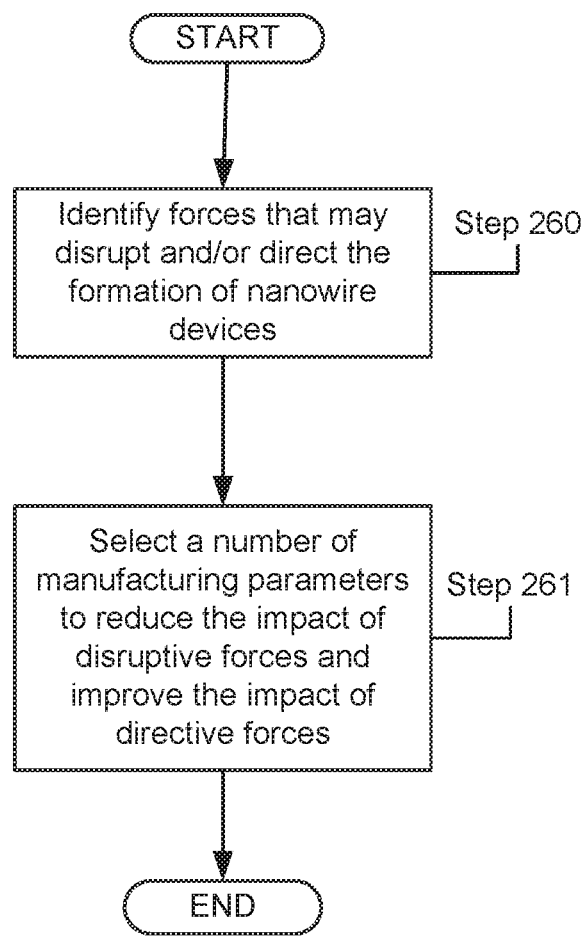
FIG. 2G shows a flowchart of a continuation of the method of FIG. 2A in accordance with one or more embodiments of the invention.

FIG. 2G shows a flowchart in accordance with one or more embodiments of the invention. The method depicted in FIG. 2G may be a continuation of the method shown in FIG. 2A in accordance with one or more embodiments of the invention. One or more steps shown in FIG. 2G may be omitted, repeated, and/or performed in a different order among different embodiments. In one or more embodiments of the invention, the method shown in FIG. 2G may be performed the method shown in FIG. 2A.

In Step 260, a number of forces that may disrupt and/or direct the formation of nanowire devices may be identified.

The forces that disrupt and/or direct may include one or more of disruptive torque, capillary force, excess nanowires, Brownian motion, electrothermal force, electroosmotic force, dielectrophoretic force, and electrode polarization.

In Step 261, a number of manufacturing process parameters may be selected to reduce the impact of disruptive forces and improve the impact of directive forces. The selected manufacturing process parameters may be used in the process shown in FIG. 2A.

The method may end following Step 261.

As discussed above, nanowire device in accordance with embodiments of the invention may be produced by the methods shown in FIGS. 2A through 2G. To further explain production of nanowire devices in accordance with embodiments of the invention, an example of a production of such a device is shown by way of example in FIGS. 3A through 3K. The example described in FIGS. 3A-3K is for exemplary purposes only and is not intended to limit the scope of the invention.

Figure 3B:
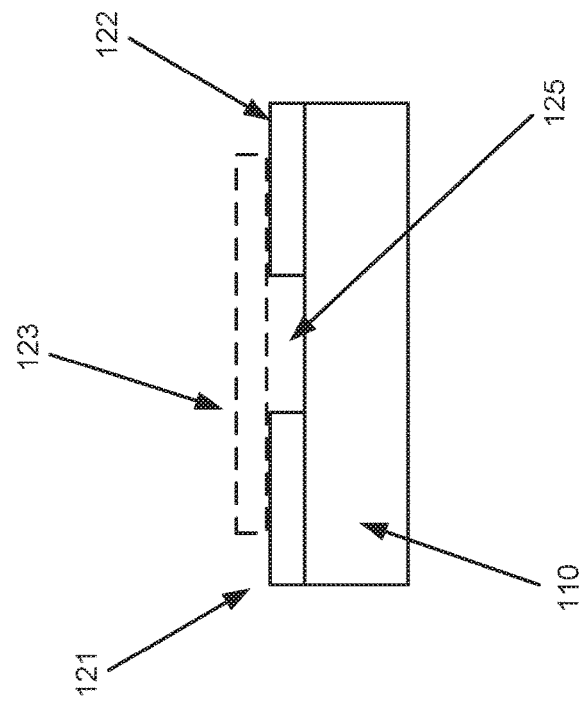
FIG. 3B shows a side view diagram of the example patterned conductive film of FIG. 3A in accordance with one or more embodiments of the invention.
Figure 3A:
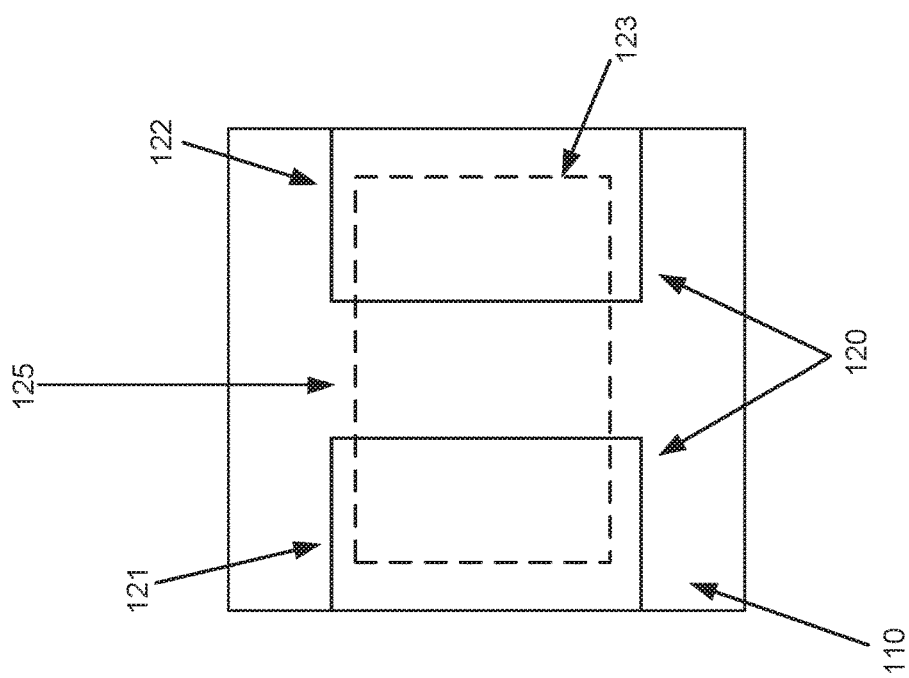
FIG. 3A shows a top view diagram of an example of a patterned conductive film in accordance with one or more embodiments of the invention.

Turing to the example, FIG. 3A shows a top view diagram of an example of a patterned conductive film (120) in accordance with embodiments of the invention. FIG. 3B shows a side view diagram of the example shown in FIG. 3A. The patterned conductive film (120) was produced by applying a conductive film to a substrate (110). The conductive film was etched to remove portions of the conductive film to form the patterned conductive film (120). The patterned conductive film includes a first portion (121) and a second portion (122). The first portion (121) and second portion (122) are separated by a gap (125) that electrically isolates the portions from each other. The first portion (121), the second portion (122), and the gap (125) may be a well-site (123) for a nanowire. Well-site (123) shown in FIGS. 3A and 3B is drawn as a dashed rectangle in each figure.

Figures 3C, 3D:
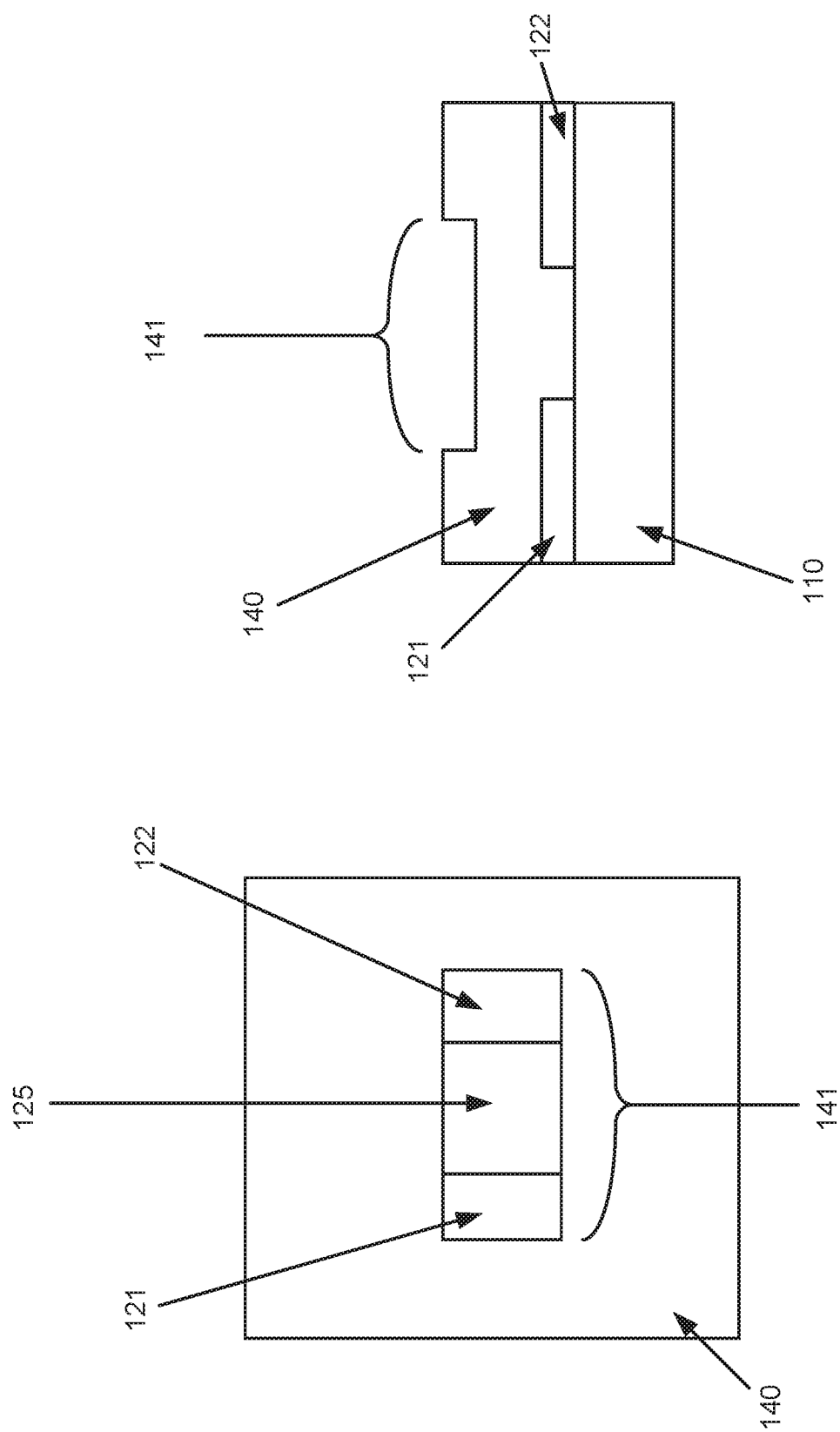
FIG. 3C shows a top view diagram of an example of a well in accordance with one or more embodiments of the invention.
FIG. 3D shows a side view diagram of the example well of FIG. 3C in accordance with one or more embodiments of the invention.

FIG. 3C shows a top view diagram of an example of forming a well (141) at the well-site of the patterned conductive film (120) in accordance with embodiments of the invention. FIG. 3C shows a side view diagram of the example shown in FIG. 3D. The well (141) was formed by applying a film (140) to the patterned conductive film. The film (140) was etched to remove a portion of the film (140) proximate to the well-site and thereby forming the well (141).

FIG. 3E shows a top view diagram of an example of applying a dam (150) to the film (140) in accordance with embodiments of the invention. FIG. 3F shows a side view diagram of the example shown in FIG. 3E. The dam (150) was applied to the film (140) by pressing the dam (150) to the film to form a flow restricted area (151). The flow restricted area (151) includes the well (141). A seal is formed between the dam (150) and the film (140) and thereby prevents material from flowing along the film (140) outside of the flow restricted area (151).

Figure 3H:
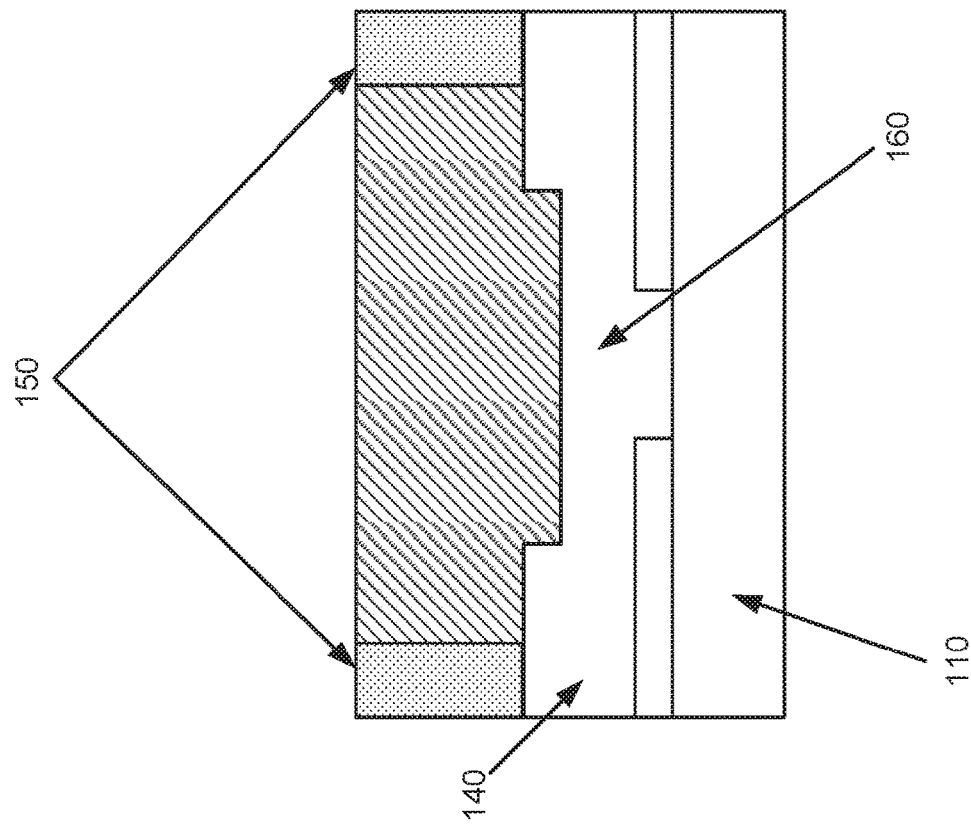
FIG. 3H shows a side view diagram of the example of applying a mixture including nanowires of FIG. 3H in accordance with one or more embodiments of the invention.
Figure 3G:
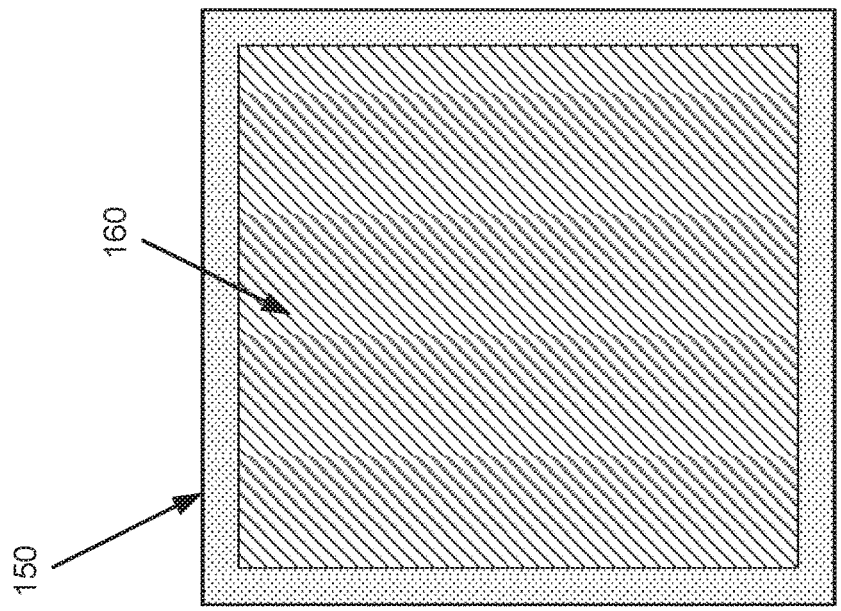
FIG. 3G shows a top view diagram of an example of applying a mixture including nanowires in accordance with one or more embodiments of the invention.

FIG. 3G shows a top view diagram of an example of applying a mixture including nanowires (160) in the flow restricted area (151) in accordance with embodiments of the invention. FIG. 3H shows a side view diagram of the example shown in FIG. 3G. The mixture including nanowires (160) was applied by dispensing the mixture including nanowires (160) in the flow restricted area. The mixture including nanowires (160) flowed to fill the flow restricted area (151) including the well-site. The film (140) is non-conducting.

Figure 3I:
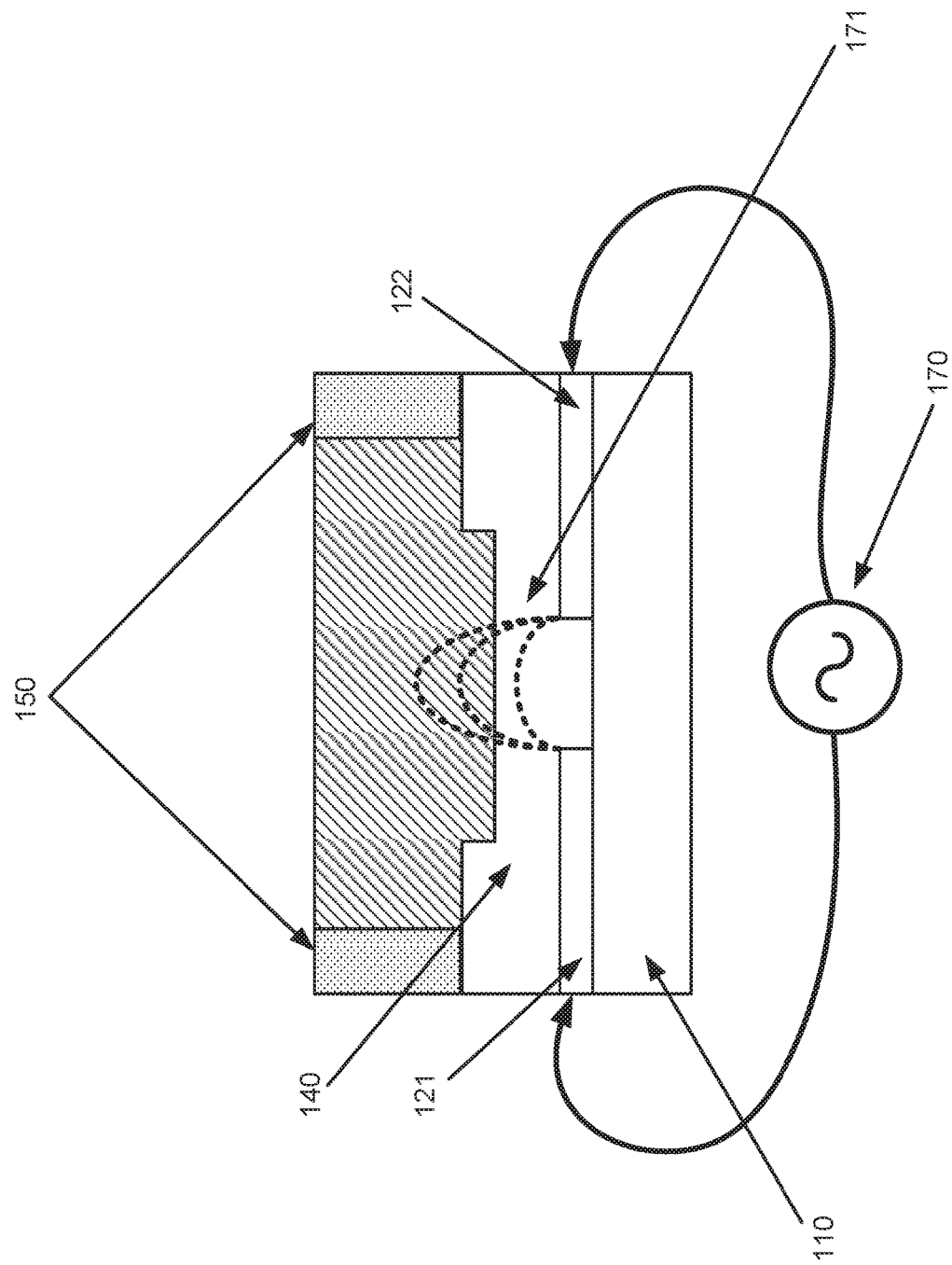
FIG. 3I shows a side view diagram of an example of applying an electric field to a mixture including nanowires in accordance with one or more embodiments of the invention.

FIG. 3I shows a side view diagram of an example of applying an electric field to the mixture including nanowires (160) in accordance with embodiments of the invention. The electric filed was applied by applying a time varying voltage, supplied by an alternating current source (170), to the first portion of the patterned conductive film (121) and the second portion of the patterned conductive film (122). Applying the voltage generated an electric field (171), indicated by dashed lines, at the well-site.

Figure 3J:
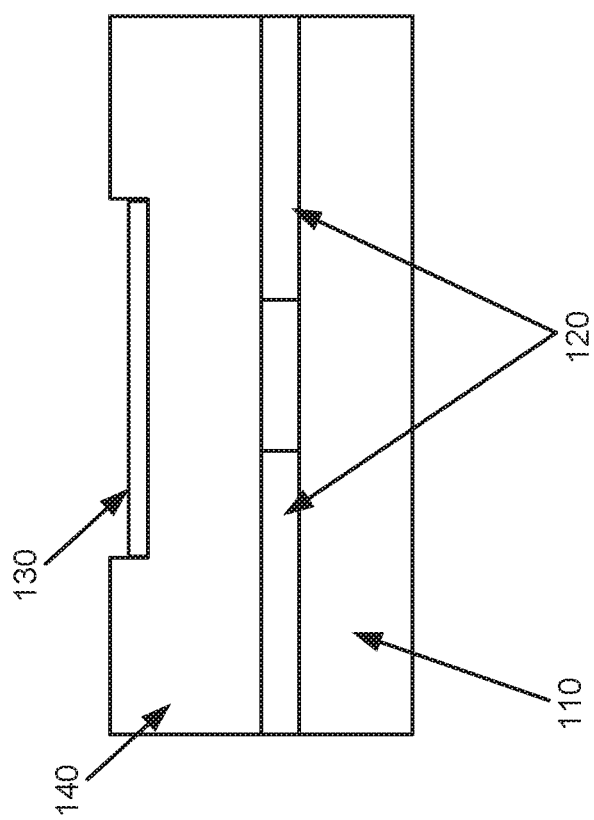
FIG. 3J shows a side view diagram of an example of a nanowire disposed at a well-site in accordance with one or more embodiments of the invention.

FIG. 3J shows a side view diagram of an example of a nanowire (130) disposed in a well proximate to the well-site after removal of the dam (150), nanowire mixture (160), and alternating current source (170) in accordance with embodiments of the invention. The nanowire mixture (160) was removed by allowing a fluid component of the mixture to evaporate. The nanowire (130) was attracted to and/or placed in the well-site by the electric field. Once placed, the nanowire (130) eliminated the electric field which prevented additional nanowires from being attracted to and/or being placed in the well-site.

Figure 3K:
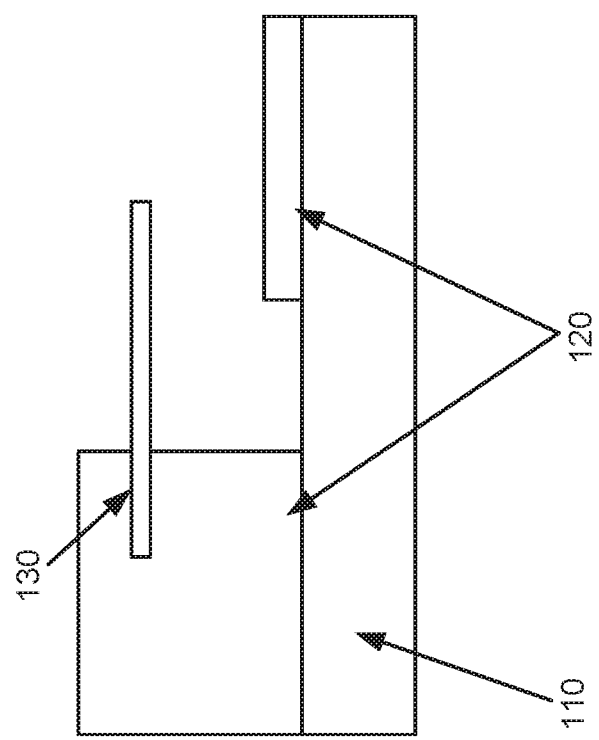
FIG. 3K shows a side view diagram of an example of a clamped nanowire in accordance with one or more embodiments of the invention.

FIG. 3K shows a side view diagram of an example of a clamped nanowire (130) disposed at the well-site in accordance with embodiments of the invention. The nanowire (130) was clamped by electrolessly depositing metal on a first end of the nanowire (130). The second end of the nanowire (130) was lifted off via a lift off procedure.

The nanowire (130) was clamped by removing a portion of the film (140) proximate to a first portion of the patterned conductive film (120), depositing conductive material on the first portion of the patterned conductive film (120) to form a contact between the nanowire (130) and the patterned conductive film (120), and removing the remaining portion of the film (140) to suspend the second end of the nanowire (130).

As discussed above, multiple nanowire devices in accordance with embodiments of the invention may be produced by the methods shown in FIGS. 2A through 2F. An example of multiple nanowire devices integrated into a device in accordance with embodiments of the invention is shown in FIG. 4.

Figure 4:
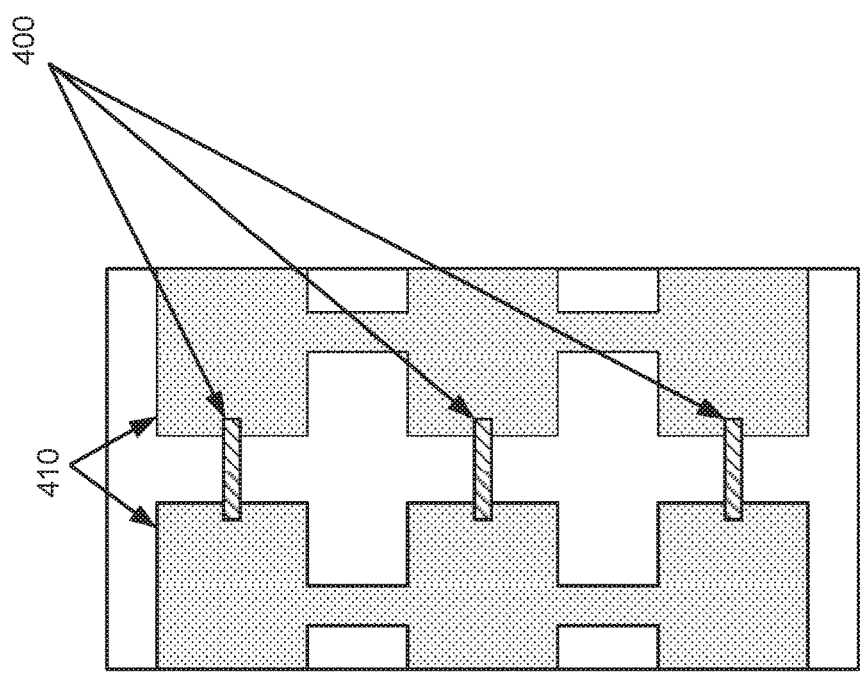
FIG. 4 shows a top view diagram of an example of multiple nanowire devices integrated into a single device in accordance with one or more embodiments of the invention.

As seen from FIG. 4, the device includes three nanowires (400). Each of the nanowires were deposited at separate well-sites via the processes described in FIGS. 2A through 2F. In this example, each of the nanowires (400) is disposed across gaps in the patterned conductive film (410). While only three nanowires (400) are shown here, any number of nanowires may be deposited at any number of well-sites without departing from the invention. For example, thousands of nanowires may be deposited at thousands of corresponding well-sites via the processes described in FIGS. 2A through 2F.

Embodiments of the invention may provide one or more of the following advantages: (i) embodiments of the invention may reduce the impact of disruptive torque, capillary action, aggregation of nanowires in a mixture, aggregation of multiple nanowires at a single wellsite, electrothermal forces, negative dielectrophoretic forces, electroosmotice forces, and/or electrode polarization that would otherwise prevent single nanowires from being deposited at well-sites, (ii) embodiments of the invention may provide a method of producing nanowire devices quickly, inexpensively, and compatible with mass electronic production techniques such as photolithography, (iii) embodiments of the invention provide a scalable method of producing nanowire devices that uses an amount of time for production that is independent of the number of nanowire devices produced, (iv) embodiments of the invention provide a high yield of nanowire devices, (v) embodiments of the invention provide a low assembly cost of nanowire devices, and (vi) embodiments of the invention provide may reduce and/or eliminate trial and error processes used to determine nanowire device manufacturing process parameters.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method of depositing nanowires, comprising:
  generating a plurality of wells disposed on a patterned conductive film comprising a plurality of well-sites, wherein the patterned conductive film covers at least a portion of a surface of a substrate, wherein each well of the plurality of wells is disposed proximate to a corresponding well-site of the plurality of well-sites;
  applying a nanowire mixture to the plurality of wells; and
  after applying the nanowire mixture, at least one nanowire is deposited on a first portion and a second portion of the patterned conductive film by generating an electric field proximate to the patterned conductive film, wherein the first portion and the second portion of the patterned conductive film are separated by a gap,
  wherein generating the plurality of wells comprises:

disposing a non-conducting film on the patterned conductive film, and removing a plurality of portions of the non-conducting film to form the plurality of wells, wherein each portion of the plurality of portions of the non-conducting film is disposed proximate to a corresponding well-site of the plurality of well-sites, wherein the non-conducting film comprises a photoresist.

2. The method of claim 1, wherein applying the nanowire mixture to the plurality of wells comprises:

obtaining a mixture comprising nanowires and a fluid;

generating a flow restricted area that surrounds the plurality of wells; and depositing a portion of the nanowire mixture in the flow restricted area.

3. The method of claim 2, wherein the fluid has a viscosity less than 5 centipoise.

4. The method of claim 2, wherein the fluid has a viscosity less than 2 centipoise.

5. The method of claim 2, wherein the fluid comprises ethanol.

6. The method of claim 2, wherein generating a flow restricted area comprises:

obtaining a dam based on a size of the patterned conductive film;

positioning the dam to surround the plurality of well-sites; and forming a seal, using the dam, that defines a size of the flow restricted area.

7. The method of claim 1, wherein the nanowire mixture comprises a quantity of nanowires that is between 1.5 and 2.5 times the number of well-sites of the plurality of well-sites.

8. The method of claim 1, wherein generating the electric field proximate to the patterned conductive film comprises:

applying a voltage across the gap; and removing a fluid from the nanowire mixture while the voltage is applied.

9. The method of claim 8, wherein applying the voltage polarizes a nanowire in the nanowire mixture.

10. The method of claim 8, wherein the voltage has a magnitude greater than 4 Vrms.

11. The method of claim 1, wherein the electric field is a time varying electric field.

12. The method of claim 1, wherein the electric field has a frequency of variation that is greater than 10 kilohertz.

13. The method of claim 1, wherein the electric field has a frequency of variation that is greater than 100 kilohertz.

14. The method of claim 1, wherein the electric field has a frequency of variation that is greater than 100 kilohertz and less than 10 gigahertz.

15. The method of claim 1, wherein the electric field has a frequency of variation based, in part, on a permittivity of the nanowire mixture.

16. The method of claim 1, wherein the electric field has a frequency of variation based, in part, on a conductivity of the nanowire mixture.

17. The method of claim 1, wherein the electric field has a frequency of variation based, in part, on a length of a gap of a well-site of the plurality of well-sites.

* * * * *